United States Patent
Park et al.

(10) Patent No.: US 10,241,143 B2
(45) Date of Patent: Mar. 26, 2019

(54) SENSING RESISTOR SHORT DETERMINER, SWITCH CONTROL CIRCUIT INCLUDING THE SAME AND POWER SUPPLY INCLUDING THE SWITCH CONTROL CIRCUIT

(71) Applicant: FAIRCHILD KOREA SEMICONDUCTOR LTD., Bucheon-si (KR)

(72) Inventors: In-Ki Park, Seoul (KR); Hyun-Chul Eum, Seoul (KR); Yong-Sang Shin, Bucheon-si (KR)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 14/567,693

(22) Filed: Dec. 11, 2014

(65) Prior Publication Data

US 2015/0168476 A1 Jun. 18, 2015

(30) Foreign Application Priority Data

Dec. 12, 2013 (KR) .................. 10-2013-0154981

(51) Int. Cl.
| | |
|---|---|
| *G01R 31/02* | (2006.01) |
| *G01R 31/40* | (2014.01) |
| *H03K 17/082* | (2006.01) |
| *H02M 3/335* | (2006.01) |
| G01R 1/20 | (2006.01) |
| H02M 1/32 | (2007.01) |
| H02M 1/00 | (2006.01) |

(52) U.S. Cl.
CPC ........... *G01R 31/025* (2013.01); *G01R 31/40* (2013.01); *H02M 3/33507* (2013.01); *H03K 17/0822* (2013.01); *G01R 1/203* (2013.01); *H02M 1/32* (2013.01); *H02M 2001/0009* (2013.01); *H03K 2217/0027* (2013.01)

(58) Field of Classification Search
CPC .............................. G01R 31/025; G01R 31/02
See application file for complete search history.

(56) References Cited

U.S. PATENT DOCUMENTS

| | | | | |
|---|---|---|---|---|
| 3,916,309 A | * | 10/1975 | Foulkes ................. | G01R 19/04 324/102 |
| 5,325,258 A | * | 1/1994 | Choi et al. ............... | H02H 3/26 361/87 |
| 2004/0120090 A1 | * | 6/2004 | Galli ...................... | H02M 1/32 361/115 |
| 2009/0147548 A1 | * | 6/2009 | Chang ............... | H02M 3/33507 363/21.18 |
| 2009/0219661 A1 | * | 9/2009 | Mitsuda ............. | H03K 17/0822 361/92 |

(Continued)

*Primary Examiner* — Jeff W Natalini
(74) *Attorney, Agent, or Firm* — AMPACC Law Group, PLLC

(57) ABSTRACT

According to the exemplary embodiments, a short-circuit of a sense resistor is detected according to a result of comparison between a sense voltage and a reference voltage at a time based on at least one of a period set based on an input sense voltage and a turn-on time of a power switch. A blanking period is set based on the input sense voltage in a current mode, and a short-circuited resistor detection period is set based on the input sense voltage.

24 Claims, 10 Drawing Sheets

(56) References Cited

U.S. PATENT DOCUMENTS

| | | | |
|---|---|---|---|
| 2010/0315843 A1* | 12/2010 | Lin | H02M 3/33523 363/21.12 |
| 2012/0140370 A1* | 6/2012 | Chen | H02H 3/093 361/87 |
| 2013/0342938 A1* | 12/2013 | Eom | H02M 1/32 361/18 |
| 2016/0028219 A1* | 1/2016 | Habu et al. | H02H 3/08 361/101 |

* cited by examiner

SENSING RESISTOR SHORT DETERMINER, SWITCH CONTROL CIRCUIT INCLUDING THE SAME AND POWER SUPPLY INCLUDING THE SWITCH CONTROL CIRCUIT

CROSS-REFERENCE TO RELATED APPLICATION

This application claims priority to and the benefit of Korean Patent Application No. 10-2013-0154981 filed in the Korean Intellectual Property Office on Dec. 12, 2013, the entire contents of which are incorporated herein by reference.

BACKGROUND (a) Field

Exemplary embodiments relate to a sense resistor short-circuit determiner, a switch control circuit including the same, and a power supply including the switch control circuit.

(b) Description of the Related Art

A switch current flowing to a power switch that controls operation of a power supply can be sensed using a sense resistor. The switch current flows to the sense resistor and thus a sense voltage is generated. A PWM controller controls switching operation of the power switch using the sense voltage.

However, when the sense resistor is short-circuited, no sense voltage is generated and thus an on-time of the power switch may be controlled to be the maximum. Then, the power supply may be abnormally operated.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention have been made in an effort to sense a short-circuit of a sense resistor.

A sense resistor short-circuit determiner according to an exemplary embodiment includes: an input voltage detector detecting an input voltage and generating an input sense voltage; and a sense voltage comparator generating a comparison signal according to a result of comparison between a sense voltage and a reference voltage, the sense voltage being generated by a current that flows from a power switch to a sense resistor. A short-circuit of the sense resistor is detected according to the comparison signal at a time based on at least one of a period set based on the input sense voltage and a turn-on time of the power switch.

The sense resistor short-circuit determiner further includes a blanking period setting unit that sets a blanking period based on the input sense voltage and generating a blanking signal indicating the blanking period. The blanking period setting unit sets the blanking period based on a time for the sense voltage to reach the reference voltage when the sense resistor is in a normal state in a detected input voltage condition.

The blanking period setting unit sets the blanking period based on an inverse of variation of the input sense voltage.

A short-circuit of the sense resistor is detected according to the blanking signal and the comparison signal during a turn-on period of the power switch.

The sense resistor short-circuit determiner further includes a logic gate the detects a short-circuit of the sense resistor by performing a logic operation on the comparison signal, the blanking signal, and a gate control signal that controls switching operation of the power switch.

A short-circuited resistor detection period is set according to a result of comparison between the input sense voltage and a predetermined peak reference voltage that is based on a peak voltage of the input sense voltage.

The sense resistor short-circuit determiner further includes an input comparator generating an input high signal that indicates the short-circuited resistor detection period when the input sense voltage is higher than the peak reference voltage.

In the short-circuited resistor detection period, a short-circuit of the resistor is detected according to the comparison signal at a power switch turn-off determination time during a turn-on period of the power switch.

The sense resistor short-circuit determiner further includes a logic gate detecting a short-circuit of the sense resistor by performing a logic operation on the input high signal, the comparison signal, and an on-time signal generated by being synchronized at the power switch turn-off determination time.

The sense resistor short-circuit determiner further includes: a peak detector detecting a peak voltage of the input sense voltage; and a multiplier generating the peak reference voltage by multiplying a predetermined gain by the peak voltage.

The sense resistor is determined to be short-circuited when the reference voltage is higher than the sense voltage at a termination time of a blanking period set based on the input sense voltage during a turn-on period of the power switch.

A short-circuit resistor detection period is set according to a result of comparison between the input sense voltage and a predetermined peak reference voltage based on a peak voltage of the input sense voltage, and the sense resistor is determined to be short-circuited when the reference voltage is higher than the sense voltage during a turn-on period of the power switch during the short-circuited resistor detection period.

A switch control circuit according to an exemplary embodiment controls a switching operation of a power switch that is electrically coupled to an input voltage. The switch control circuit includes: a PWM controller controlling the switching operation of the power switch using a sense voltage generated by a current of the power switch flowing to a resistor; and a sense resistor short-circuit determiner generating an input sense voltage by detecting the input voltage, and detecting a short-circuit of the sense resistor according to a result of a comparison between the sense voltage and a reference voltage at a time based on at least one of a period set based on the input sense voltage and a turn-on period of the power switch.

A power supply according to an exemplary embodiment includes: a power switch electrically coupled to an input voltage; a sense resistor coupled to the power switch to sense a current flowing through the power switch; and a sense resistor short-circuit determiner generating an input sense voltage by detecting the input voltage, and detecting a short-circuit of the sense resistor according to a result of comparison between a sense voltage of the sense resistor and a reference voltage at a time based on at least one of a period set based on the input sense voltage and a turn-on period of the power switch.

The sense resistor short-circuit determiner determines the sense resistor to be short-circuited when the reference voltage is higher than the sense voltage at a termination time of a blanking period which is set based on the input sense voltage during the turn-on time of the power switch.

The sense resistor short-circuit determiner sets a short-circuited resistor detection period according to a result of comparison between the input sense voltage and a predetermined peak reference voltage based on a peak voltage of the input sense voltage, and determines the sense resistor to be short-circuited when the reference voltage is higher than the sense voltage during a turn-on period of the power switch in the short-circuited resistor detection period.

The power supply further includes an auxiliary wire electromagnetically coupled with a primary wire coupled to the input voltage, wherein an auxiliary voltage, which is a voltage between lateral ends of the auxiliary wire, is a negative voltage that depends on the input voltage during a turn-on period of the power.

The sense resistor short-circuit determiner may generate the input sense voltage using a voltage sense current supplied to the auxiliary wire to clamp a voltage of a node coupled to the auxiliary wire to a predetermined voltage during the turn-on period of the power switch.

The reference voltage is based on the input sense voltage.

According to the exemplary embodiments of the present invention, a sense resistor short-circuit determiner that can sense a short-circuit of a sense resistor, a switch control circuit including the same, and a power supply including the switch control circuit can be provided.

DETAILED DESCRIPTION OF THE EMBODIMENTS

Figure 1:
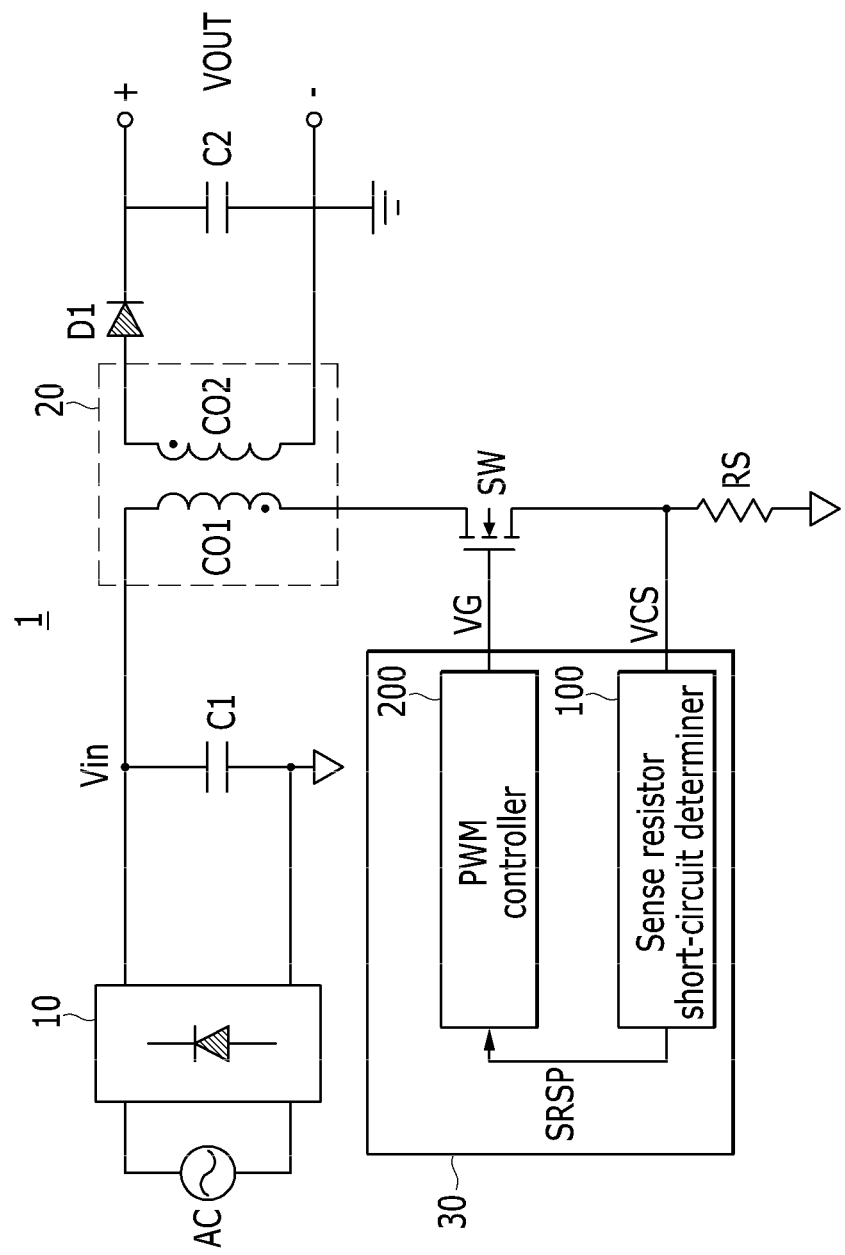
FIG. 1 shows a power supply to which a sense resistor short-circuit determiner is applied.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

A sense resistor short-circuit determiner according to the exemplary embodiment detects a short-circuit of a sense resistor by controlling a blanking period according to an input voltage. An input voltage rectified from an AC input is changed, and a rising slope of a switch current is changed according to the input voltage. When the sense resistor is in a normal state, a sense voltage is determined according to the switch current and therefore the rising slope of the sense voltage is changed according to the input voltage.

Time for sensing whether or not the sense resistor is in the normal state is changed according to the input voltage. For example, time consumed for sensing whether or not a sense voltage is generated is shortened as the rising slope of the sense voltage is increased. On the contrary, time consumed for sensing whether or not a sense voltage is generated is increased as the rising slope of the sense voltage is decreased.

The sense resistor short-circuit determiner according to the exemplary embodiment senses the input voltage to control a blanking period according to the input voltage, and determines the sense resistor to be short-circuited if the sense voltage is lower than a reference voltage after the blanking period has passed.

Hereinafter, the sense resistor short-circuit determiner according to the exemplary embodiment will be described with reference to the accompanying drawings.

FIG. 1 illustrates a power supply to which the sense resistor short-circuit determiner is applied.

As shown in FIG. 1, a power supply 1 includes a rectification circuit 10, a capacitor C1, a transformer 20, a rectification diode D1, an output capacitor C2, a power switch SW, a sense resistor RS, and a switch control circuit 30.

An AC input AC is rectified through the rectification circuit 10, and the rectified AC input becomes an input voltage Vin through the capacitor C1. The rectification circuit 10 may be a full-bridge diode which is a full-wave rectification circuit. For example, the input voltage Vin may be a full-wave rectified sine wave.

The transformer 20 includes a primary wire CO1 connected to the input voltage Vin and a secondary wire CO2 connected to an output voltage Vout. The primary wire CO1 and the secondary wire CO2 are coupled in an insulated manner with a predetermined turn ratio (turns of primary wire C01: turns of secondary wire CO2).

A first end of the primary wire CO1 is connected to the input voltage Vin and a second end of the primary wire CO1 is connected to a first electrode (i.e., a drain) of the power switch SW. A current that flows during a turn-on period of the power switch SW flows to the primary wire CO1 such that energy is stored.

A first end of the secondary wire CO2 is connected to an anode of the rectification diode D1 and a second end of the secondary wire CO2 is connected to a secondary ground. During a turn-off period of the power switch SW, energy stored in the primary wire CO1 is transmitted to the secondary wire CO2.

The power switch SW is electrically connected to the input voltage Vin, and controls output power of the power supply 1. A gate of the power switch SW is connected to a gate voltage VG supplied from the switch control circuit 30, and a second electrode (i.e., a source) of the power switch SW is connected to a primary ground through the sense resistor RS. The power switch SW is turned on by a high-level gate voltage VG and turned off by a low-level gate voltage VG.

The sense resistor RS is connected between the source and the primary ground of the power switch SW, and a resistor voltage VCS is generated in the sense resistor RS according to a current flowing to the power switch SW.

The output capacitor C2 is connected between lateral output ends of the power supply 1. A first electrode of the output capacitor C2 is connected to a cathode of the rectification diode D1 and a second electrode of the output capacitor C2 is connected to the secondary ground.

A current flowing to the secondary wire CO2 passes through the rectification diode D1. The current passed through the rectification diode D1 may be applied to a load (not shown) or charge the output capacitor C2.

The switch control circuit 30 includes a PWM controller 200 and a sense resistor short-circuit determiner 100.

The PWM controller 200 is synchronized by an oscillator signal that determines a switching frequency and thus turns on the power switch SW, and turns off the power switch SW when the sense voltage VCS reaches a feedback voltage that corresponds to the output voltage VOUT (hereinafter, a current mode). Alternatively, the PWM controller 200 is synchronized by the oscillator signal and thus turns on the power switch SW, and turns off the power switch SW when a sawtooth wave signal having a predetermined period reaches the feedback voltage (hereinafter, a voltage mode).

The sense resistor short-circuit determiner 100 generates an input sense voltage VIS by sensing the input voltage Vin, and determines whether or not the sense resistor RS is short-circuited according to a result of comparison between the input sense voltage VIS and a reference voltage VR at a time based on a period (hereinafter referred to as a blanking period or a short-circuited resistor detection period) set based on the input sense voltage VIS and an on-period of the power switch SW. The reference voltage VR may be set to a predetermined voltage or be set to be based on the input voltage Vin. For example, the sense resistor short-circuit determiner 100 determines the reference voltage VR based on the input sense voltage VIS.

First, a blanking period is set based on the input sense voltage VIS in the current mode, and the sense resistor short-circuit determiner 100 sets the blanking period according to the input sense voltage VIS and determines the sense resistor RS to be short-circuited when the reference voltage VR is higher than the sense voltage VCS at a time when the blanking period is passed during the turn-on period of the power switch SW.

For example, in a normal state during which the sense resistor RS is not short-circuited, the sense resistor short-circuit determiner 100 may set a blanking period based on a first period during which the sense voltage VCS reaches the reference voltage VR in a detected input voltage condition. In detail, the blanking period may be set to a period acquired by adding a predetermined margin to the first period.

However, the exemplary embodiment of the present invention is not limited thereto, and the blanking period may be set with other methods.

For example, the sense resistor short-circuit determiner 100 may set the blanking period so as to have a predetermined ratio with respect to the maximum allowable duty in the detected input voltage condition. The predetermined ratio can be modified according to a design condition.

Figure 2:
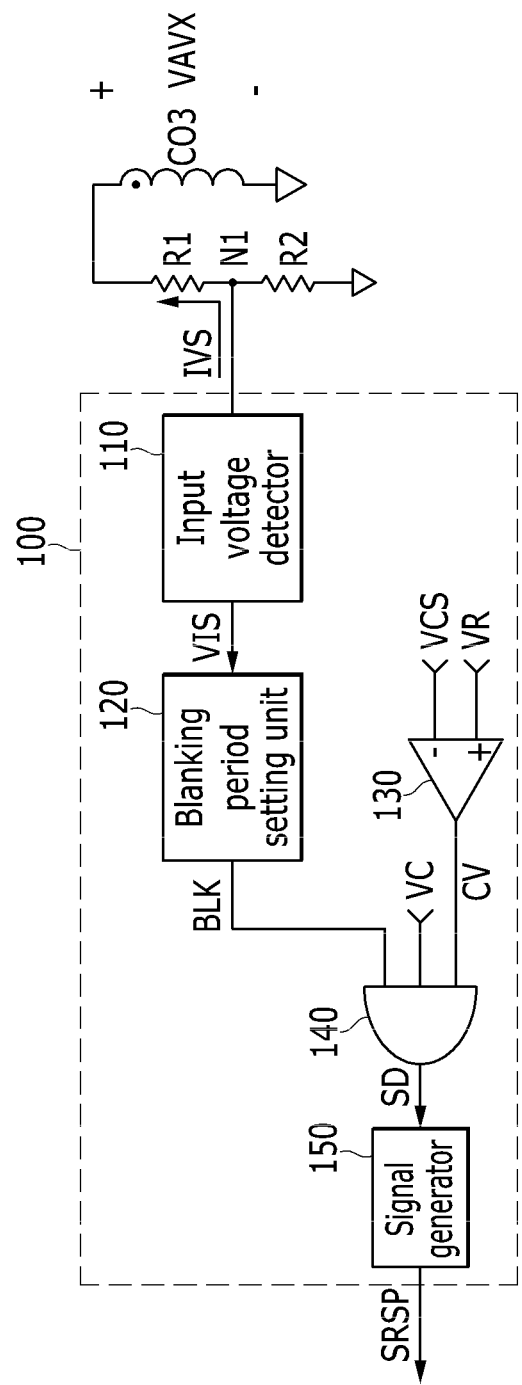
FIG. 2 shows the sense resistor short-circuit determiner according to the exemplary embodiment of the present invention.

FIG. 2 shows the sense resistor determiner according to the exemplary embodiment of the present invention.

The sense resistor short-circuit determiner of FIG. 2 can be applied to the current mode. The sense resistor short-circuit determiner 100 according to the exemplary embodiment may use an auxiliary wire CO3 for detection of the input voltage Vin. The auxiliary wire is provided in the primary side of the power supply 1 of FIG. 1, and is electromagnetically coupled with the primary wire CO1 with a predetermined turn ratio. Hereinafter, the turn ratio of the primary wire CO1 and the auxiliary wire CO3 is set to be 1:1 for convenience of description.

A voltage between both ends of the primary wire CO1 during the turn-on period of the power switch SW is the input voltage Vin. A polarity of a voltage (hereinafter referred to as an auxiliary voltage VAUX) between both ends of the auxiliary wire CO3 is opposite to a polarity of the voltage between both ends of the primary wire C01, and therefore the auxiliary voltage VAUX of the auxiliary voltage VO3 is −Vin during the turn-on period of the power switch SW.

During the turn-off period of the power switch SW, the voltage between both ends of the primary wire CO1 is a negative voltage that is proportional to the output voltage VOUT, and the auxiliary voltage VAUX is a positive voltage that is proportional to the output voltage VOUT.

The sense resistor short-circuit determiner 100 detects the input voltage Vin using the voltage sense current IVS supplied to the auxiliary wire CO3 during the turn-on period of the power switch SW. The sense resistor short-circuit determiner 100 generates a blanking signal BLK that indicates a blanking period according to an input sense voltage VIS corresponding to the detected input voltage Vin, and determines whether or not the sense voltage RS is short-circuited during the turn-on period of the power switch SW based on the blanking signal BLK and a result of comparison between the sense voltage VCS and the predetermined reference voltage Vref. The sense resistor short-circuit determiner 100 determines the sense resistor RS to be short-circuited when the sense voltage VCS cannot reach the reference voltage RS during the turn-on period of the power switch SW.

The sense resistor short-circuit determiner 100 includes an input voltage detector 110, a blanking period setting unit 120, a sense voltage comparator 130, an AND gate 140, and a signal generator 150. Two resistors R1 and R2 are connected in series between a first end of the auxiliary wire CO3 and a primary ground, and a second end of the auxiliary wire CO3 is connected to the primary ground.

The input voltage detector 110 generates the voltage sense current IVS according to the auxiliary voltage VAUX generated during the turn-on period of the power switch SW, and generates the input sense voltage VIS corresponding to the input voltage Vin according to the magnitude of the voltage sense current IVS.

In detail, the input voltage detector 110 generates the voltage sense current IVS for clamping a voltage of a node N1 to be higher than a predetermined voltage. When the predetermined voltage is a primary ground voltage, the voltage sense current IVS is Vin/R1 during the turn-on period of the power switch SW. That is, the voltage sense current IVS may be proportional to the input voltage Vin during the turn-on period of the power switch SW. During the turn-off period of the power switch SW, the auxiliary voltage VAUX is higher than the primary ground voltage and thus the voltage sense current IVS does not flow.

The input voltage detector 110 generates the input sense voltage VIS by converting the voltage sense current IVS to a voltage. For example, the input voltage detector 110 mirrors the voltage sense current IVS, and flows the mirrored current to the resistor so as to generate the input sense voltage VIS.

The blanking period setting unit 120 sets the blanking period based on the input sense voltage VIS, and generates a blanking signal BLK that indicates the blanking period. For example, the blanking period setting unit 120 may generate a disable-level blanking signal BLK during the blanking period.

The blanking period setting unit 120 may set the blanking period based on the inverse direction of the variation of the input sense voltage VIS. That is, the blanking period is shortened when the input sense voltage VIS is increased and the blanking period is increased when the input sense voltage VIS is decreased. The blanking period setting unit 120 may generate a low-level blanking signal BLK during the blanking period.

The sense voltage comparator 130 generates a comparison signal CV according to a result of comparison between the reference voltage VR and the sense voltage VCS. The sense voltage comparator 130 includes a non-inversion terminal (+) to which the reference voltage VR is supplied and an inversion terminal (−) to which the sense voltage VCS is supplied, and generates a high-level comparison signal CV when an input of the non-inversion terminal (+) is higher than an input of the inversion terminal (−) and generates a low-level comparison signal CV in the opposite case.

The AND gate 140 generates a shut-down signal SC by performing an AND operation on the blanking signal BLK, the gate control signal VC, and the comparison signal CV. The gate control signal VC is one of signals that control a switching operation of the power switch SW, and may be one of enable-level signals in the turn-on period of the power switch SW. For example, the gate voltage VG may be the gate control signal VC.

In the present exemplary embodiment, the AND gate is used to generate the shut-down signal SD that indicates a short-circuit of the sense resistor RS, but the exemplary embodiment of the present invention is not limited thereto. An appropriate logic gate may be used according to the blanking signal BLK, the gate control signal VC, and the comparison signal CV.

The signal generator 150 is triggered by the shut-down signal SD and generates a sense resistor short-circuit detection signal SRSD. For example, the signal generator 150 may be synchronized with a rising edge of the shut-down signal SD and may thus generate an enable-level sense resistor short-circuit protection signal SRSP. The PWM controller 200 may generate a gate voltage VG that turns off the power switch SW for protection by the enable-level sense resistor short-circuit protection signal SRSP.

In the exemplary embodiment of FIG. 1, the auxiliary wire CO3 is used to detect the input voltage Vin, but the exemplary embodiment of the present invention is not limited thereto. The sense resistor short-circuit determiner may be connected to the input voltage Vin without using the auxiliary wire CO3.

Figure 3:
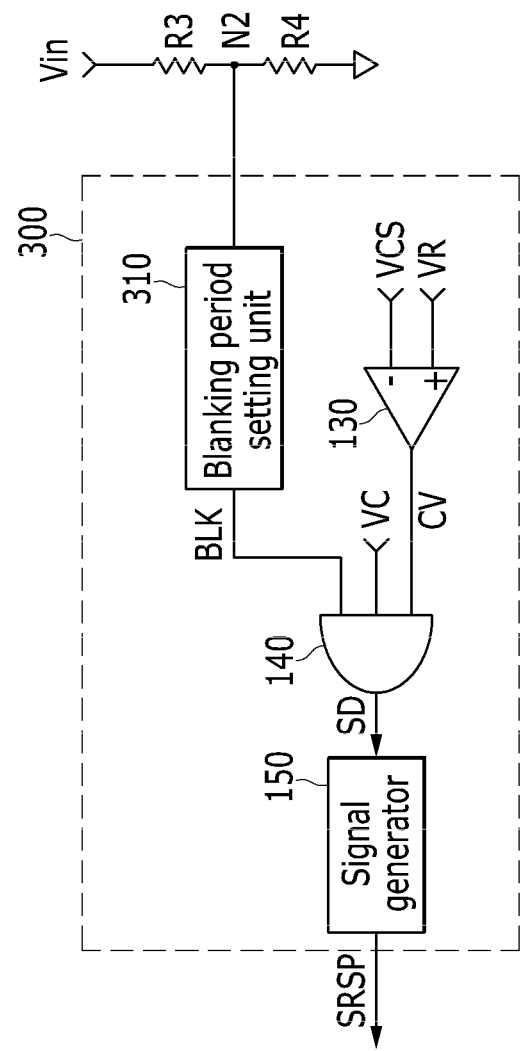
FIG. 3 shows a sense resistor short-circuit determiner according to another exemplary embodiment of the present invention.

FIG. 3 shows a sense resistor short-circuit determiner according to another exemplary embodiment of the present invention.

As shown in FIG. 3, a sense resistor short-circuit determiner 300 is connected to a node N2 where two resistors R3 and R4 connected in series between an input voltage Vin and a primary ground are connected. A voltage of the node N2 is Vin*(R4/(R3+R4)), and is thus proportional to the input voltage Vin.

The sense resistor short-circuit determiner 300 includes a blanking period setting unit 310, a sense voltage comparator 130, an AND gate 140, and a signal generator 150. The sense voltage comparator 130, the AND gate 140, and the signal generator 150 are the same as those in the previous exemplary embodiment, therefore no further description will be provided.

The blanking period setting unit 310 receives a voltage (hereinafter referred to as an input sense voltage) VN2 of the node N2, sets a blanking period based on the input sense voltage VN2, and generates a disable-level blanking signal BLK during a blanking period. For example, the blanking period setting unit 310 may set a blanking period based on the inverse of a variation of the input sense voltage VN2 and may generate a low-level blanking signal BLK during the blanking period.

Hereinafter, an operation according to the exemplary embodiments will be described with reference to FIG. 4 and FIG. 5.

Figure 4:
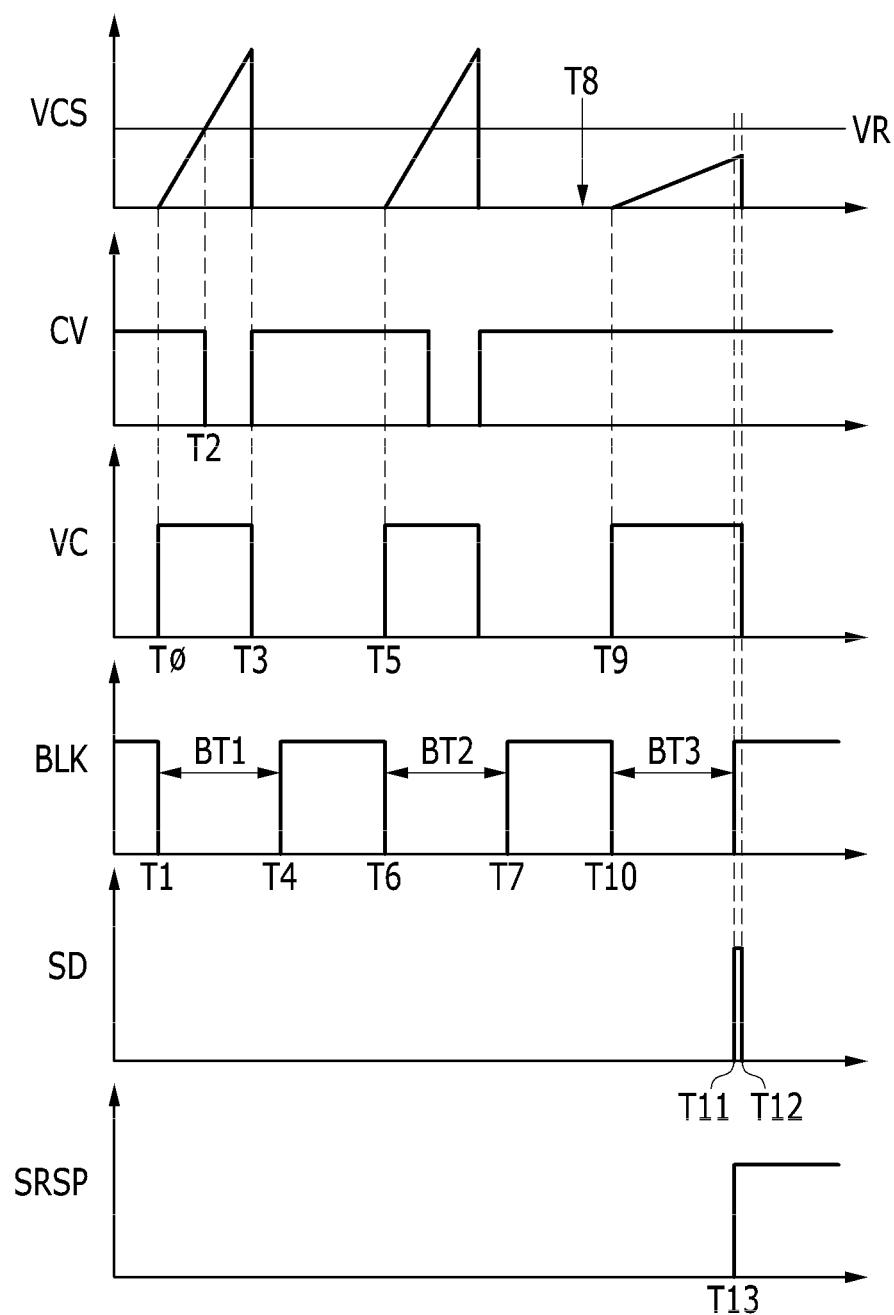
FIG. 4 is a waveform diagram of a sense voltage, a comparison signal, a gate control signal, a blanking signal, a shut-down signal, and a short-circuit detection signal according to the exemplary embodiment of the present invention.

FIG. 4 is a waveform diagram illustrating a sense voltage, a comparison signal, a gate control signal, a blanking signal, a shut-down signal, and a short-circuit detection signal according to the exemplary embodiment of the present invention.

Figure 5:
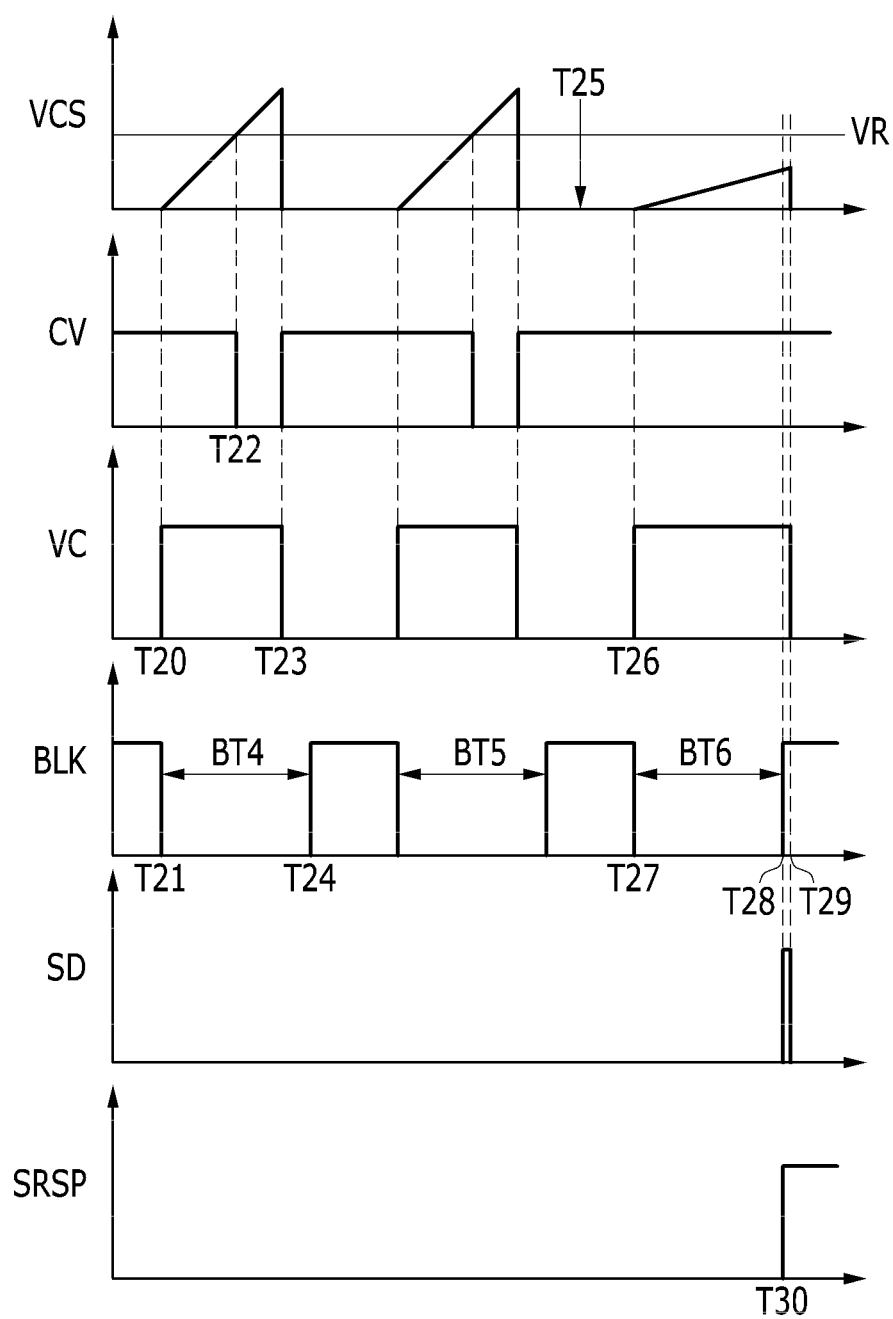
FIG. 5 is a waveform diagram of a sense voltage, a comparison signal, a gate control signal, a blanking signal, a shut-down signal, and a short-circuit detection signal according to the exemplary embodiment of the present invention when the input voltage is lower than the input voltage of FIG. 4.

FIG. 5 a waveform diagram illustrating a sense voltage, a comparison signal, a gate control signal, a blanking signal, a shut-down signal, and a short-circuit detection signal when the input signal is lower than the input voltage of FIG. 4 according to the exemplary embodiment of the present invention.

As shown in FIG. 4, at T0, the gate control signal VC becomes a high level and thus the power switch SW is turned on and the sense voltage VCS starts to increase. At T1, the blanking signal BLK becomes a low level, and at T4, the blanking signal BLK becomes high level. A period T1 to T4 is a blanking period BT1. The blanking period BT1 may be determined according to an input voltage Vin measured during the previous cycle of the power switch SW immediately before T1. T1 is synchronized by T0. For example, T0 and T1 may be an equivalent time.

At T2, the increasing sense voltage VCS reaches the reference voltage VR and thus the comparison signal CV becomes the low level. At T3, the gate control signal VC becomes the low level and the power switch SW is turned off, the sense voltage VCS is not generated, and the comparison signal CV becomes the high level.

At T5, the gate control signal VC becomes the high level again and thus the power switch SW is turned on, and the sense voltage VCS starts to increase. At T6, the blanking signal BLK becomes the low level, and at T7, the blanking signal BLK becomes the high level. A period T6 to T7 is a blanking period BT2. The blanking period BT2 may be determined according to the input voltage Vin measured during the switching cycle T0 to T5 of the power switch SW.

In the normal state and when the sense resistor RS is not short-circuited, the above-stated operation is maintained.

It is assumed that a short-circuit of the sense resistor RS occurs at T8.

Although the gate control signal VC becomes the high level at T9 and thus the power switch SW is turned on, the sense voltage VCS is not increased with a normal slope, unlike in the normal state. Although there is a difference according to the degree of short-circuit, FIG. 4 exemplarily illustrates that the sense voltage VCS increased with a less steep slope for convenience of description. However, the exemplary embodiment of the present invention is not limited thereto.

At T10, the blanking signal BLK becomes the low level, and at T11, the blanking signal BLK becomes the high level. A period T10 to T11 is a blanking period BT3.

Since the sense voltage VCS is lower than the reference voltage VR at T11 at which the blanking period BT3 is terminated, the comparison signal CV becomes the high level and the sense voltage VCS is lower than the feedback voltage, and therefore the gate control signal VC is the high level.

From T11, the blanking period BT3 is terminated and the blanking signal BLK becomes the high level. Therefore, all inputs of the AND gate 140 become the high level from T11 and thus the shut-down signal SD becomes the high level. Then, the short-circuit detection signal SRSP is increased to the high level at T13. That is, the protection operation due to detection of a short-circuit is triggered, and thus the gate control signal VC becomes the low level at T12 and thus the power switch SW is turned off and the short-down signal SD becomes the low level.

FIG. 4 illustrates that the blanking signal BLK is maintained with the high level while the protection operation is maintained after T11, but the exemplary embodiment of the present invention is not limited thereto.

When the input voltage Vin is decreased, the blanking period is increased.

As shown in FIG. 5, at T20, the gate control signal VC becomes the high level and thus the power switch SW is turned on, and the sense voltage VCS starts to increase. At T21, the blanking signal BLK becomes the low level, and at T24, the blanking signal BLK becomes the high level. A period T21 to T24 is a blanking period BT4. The blanking period BT4 may be determined according to an input voltage Vin measured during the previous switching cycle of the power switch SW immediately before T20. T21 is synchronized by T20. For example, T20 and T21 may be an equivalent time.

At T22, the increasing sense voltage VCS reaches the reference voltage VR and thus the comparison signal CV becomes the low level. Since the input voltage level of FIG. 5 is lower than the input voltage level of FIG. 4, a rising slope of the sense voltage VCS is less steep than that of FIG. 4. At T23, the gate control signal VC becomes the low level and thus the power switch SW is turned off, and the sense voltage VCS is not generated and the comparison signal CV becomes the high level.

The blanking period BT5 and the blanking period BT6 may be determined according to an input voltage Vin measured during the previous switching cycle of the power switch SW. In the normal state when the sense resistor RS is not short-circuited, the above-stated operation is maintained.

It is assumed that a short-circuit of the sense resistor RS occurs at T25.

Although the gate control signal VC becomes the high level and thus the power switch SW is turned on at T26, the sense voltage VCS is not increased as in the normal state.

At T27, the blanking signal BLK becomes the low level again, and at T28, the blanking signal BLK becomes the high level. Since the sense voltage VCS is lower than the reference voltage VR when the blanking period BT6 is terminated at T28, the comparison signal CV is the high level and the sense voltage VCS is lower than the feedback voltage, and thus the gate control signal VC is the high level.

The blanking period BT6 is terminated from T28, and the blanking signal BLK becomes the high level. Therefore, all inputs of the AND gate 140 become the high level from T28 so that the shut-down signal SD becomes the high level. Then, the short-circuit detection signal SRSP is increased to the high level at T30. That is, the protection operation due to detection of a short-circuit is triggered, and thus the gate control signal VC becomes the low level, the power switch SW is turned off, and the shut-down signal SD becomes the low level at T29.

As described, the blanking period varies according to the input voltage, and a short-circuit of the sense resistor can be determined according to the sense voltage after the blanking period is passed.

Hereinafter, an exemplary embodiment in which a short-circuit of the sense resistor is determined in the voltage mode will be described. In the voltage mode, the sense resistor short-circuit determiner sets a short-circuited resistor detection period based on the input sense voltage, and determines the sense resistor RS to be short-circuited when the reference voltage VR is higher than the sense voltage VS during the turn-on period of the power switch SW.

Figure 6:
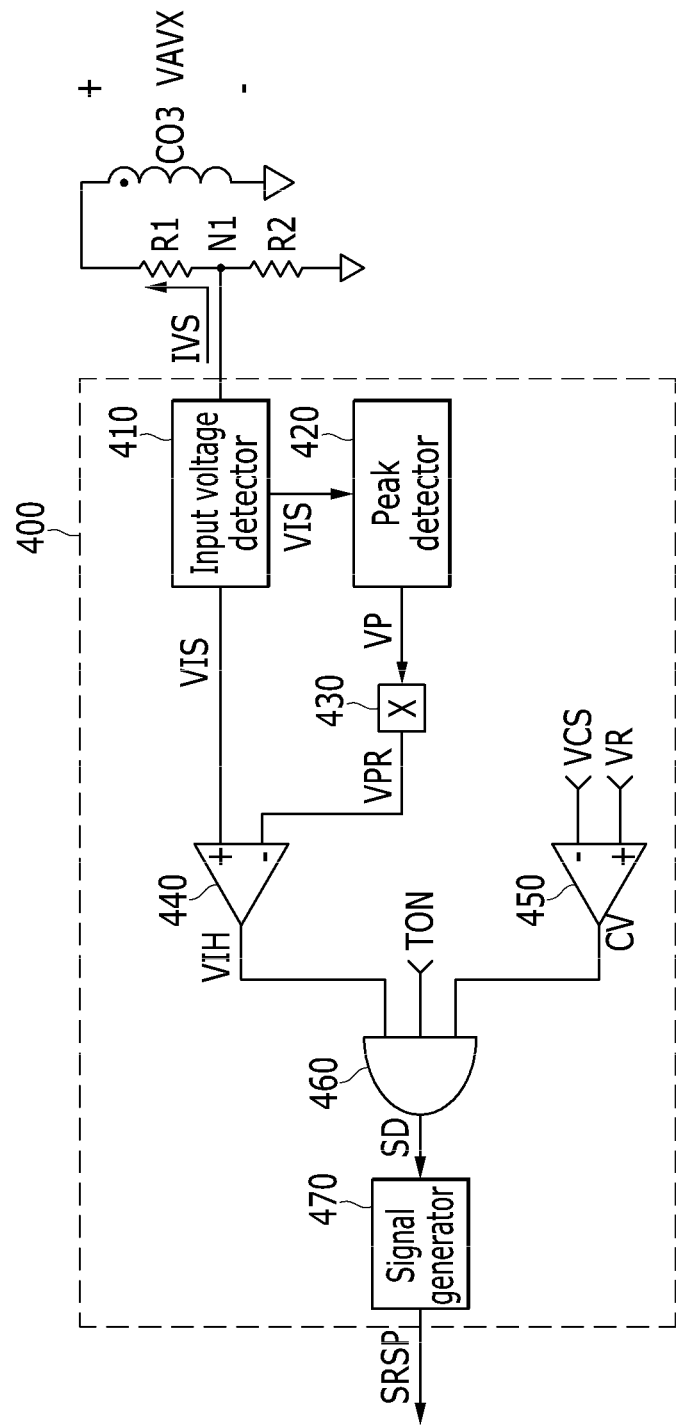
FIG. 6 shows a sense resistor short-circuit determiner according to another exemplary embodiment of the present invention.

FIG. 6 shows a sense resistor short-circuit determiner according to another exemplary embodiment of the present invention.

A sense resistor short-circuit determiner 400 detects an input voltage Vin, detects a peak voltage VP of an input sense voltage VIS corresponding to the detected input voltage Vin, and sets a peak reference voltage VPR based on the peak voltage VP. The sense resistor short-circuit determiner 400 sets a short-circuited resistor detection period according to a result of comparison between the input sense voltage VIS and the peak reference voltage VPR, and determines a sense resistor RS to be short-circuited when the sense voltage VCS cannot reach the reference voltage VR during a turn-on period of the power switch SW in the short-circuited resistor detection period.

The sense resistor short-circuit determiner 400 shown in FIG. 6 detects the input voltage Vin using a voltage sense current IVS supplied to an auxiliary wire CO3, but the present exemplary embodiment is not limited thereto. As shown in FIG. 3, the sense resistor short-circuit determiner 400 may be connected to the input voltage Vin.

The sense resistor short-circuit determiner 400 includes an input voltage detector 410, a peak detector 420, a multiplier 430, an input comparator 440, a sense voltage comparator 450, an AND gate 460, and a signal generator 470.

The input voltage detector 410 generates the voltage sense current IVS according to an auxiliary voltage VAUX generated during a turn-on period of the power switch SW, and generates the input sense voltage VIS corresponding to the input voltage Vin according to the magnitude of the voltage sense current IVS. Since the input voltage detector 410 is the same as the input voltage detector 110 of FIG. 2, no further description will be provided.

The peak detector 420 receives the input sense voltage VIS, and generates a peak voltage VP by detecting a peak of the input sense voltage VIS.

The multiplier 430 generates a peak reference voltage VPR that determines the short-circuited resistor detection period by multiplying a predetermined gain to the peak voltage VP. The gain in the present exemplary embodiment is set to not determine whether or not the sense resistor RS is short-circuited when the input voltage Vin is a low-level voltage. For example, the sense voltage VCS may be lower than the reference voltage VR during the turn-on period of the power switch SW not by a short-circuit of the sense resistor RS, but by a level of the input voltage Vin. When the input voltage Vin is higher than a predetermined voltage, the gain of the multiplier 430 may be set to set the short-circuited resistor detection period for detecting a short-circuit of the sense resistor RS.

The input comparator 440 generates an input high signal VIH that instructs the short-circuited resistor detection period according to a result of comparison between the input sense voltage VIS and the peak reference voltage VPR.

The sense voltage comparator 450 generates a comparison signal CV according to a result of comparison between the reference voltage VR and the sense voltage VCS. The sense voltage comparator 450 includes a non-inversion terminal (+) to which the reference voltage VR is supplied and an inversion terminal (−) to which the sense voltage VCS is supplied, and generates a high-level comparison signal CV when an input of the non-inversion terminal (+) is higher than an input of the inversion terminal (−) and generates a low-level comparison signal CV in the opposite case.

The AND gate 460 generates a shut-down signal SD by performing an AND operation on the input high signal, an on-time signal TON, and the comparison signal CV. The on-time signal TON is a signal generated by being synchronized at a turn-off time of the power switch SW. The on-time signal TON will be described later with reference to FIG. 10.

The signal generator 470 is triggered by the shut-down signal SD and generates the sense resistor short-circuit detection signal SRSD. For example, the signal generator 470 may generate an enable-level sense resistor short-circuit protection signal SRSP by being synchronized with a rising edge of the shut-down signal SD. The PWM controller 200 may generate a gate voltage VG that turns off the power switch SW as a protection operation by the enable-level sense resistor short-circuit protection signal SRSP.

Hereinafter, operation of the sense resistor short-circuit determiner 400 will be described with reference to FIG. 7 to FIG. 10.

Figure 7:
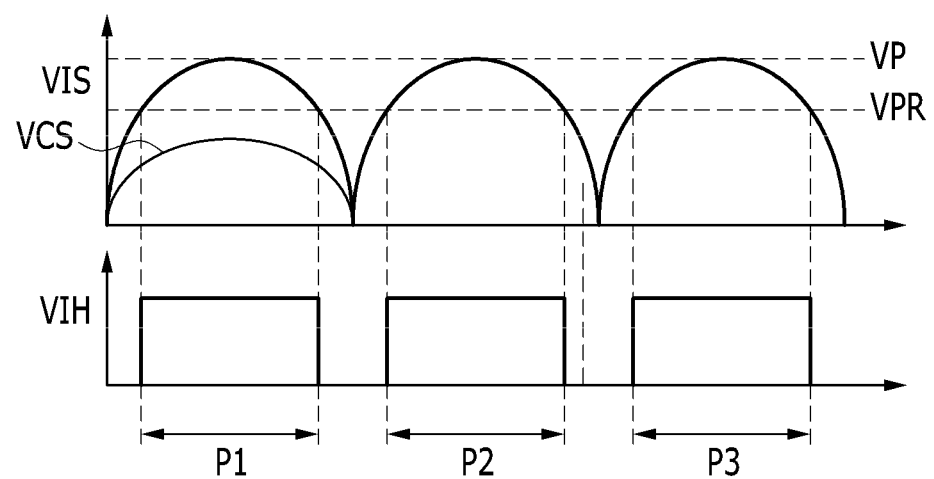
FIG. 7 is a waveform diagram illustrating an input sense voltage, a sense voltage, an input high signal, and a peak reference voltage according to another exemplary embodiment of the present invention in a normal state.

FIG. 7 is a waveform diagram illustrating an input sense voltage, a sense voltage, an input high signal, and a peak reference voltage according to another exemplary embodiment of the present invention in a normal state.

FIG. 7 illustrates that an input sense voltage VIS is a full-wave rectified sine wave corresponding to an input voltage Vin illustrated as a full-wave rectified sine wave. However, the waveform of the input voltage Vin is not limited to the exemplary embodiment shown in FIG. 7.

A sense voltage VCS is increased with a slope that depends on the input voltage Vin during a turn-on period of the power switch SW, and has a waveform that is decreased to a zero voltage at a turn-off time of the power switch SW. For convenience of description, the sense voltage VCS shown in FIG. 7 is illustrated as a waveform that connects peaks of the sense voltage VCS generated at every switching period.

As shown in FIG. 7, a peak reference voltage VPR is lower than a peak voltage VP because a gate of the multiplier 430 is multiplied to the peak voltage VP.

Periods during which the input sense voltage VIS is higher than the peak reference voltage VPR, that is, P1, P2, and P3, are set to short-circuited resistor detection periods, and the input high signal VIH is the high level in P1, P1, and P3.

Figure 8:
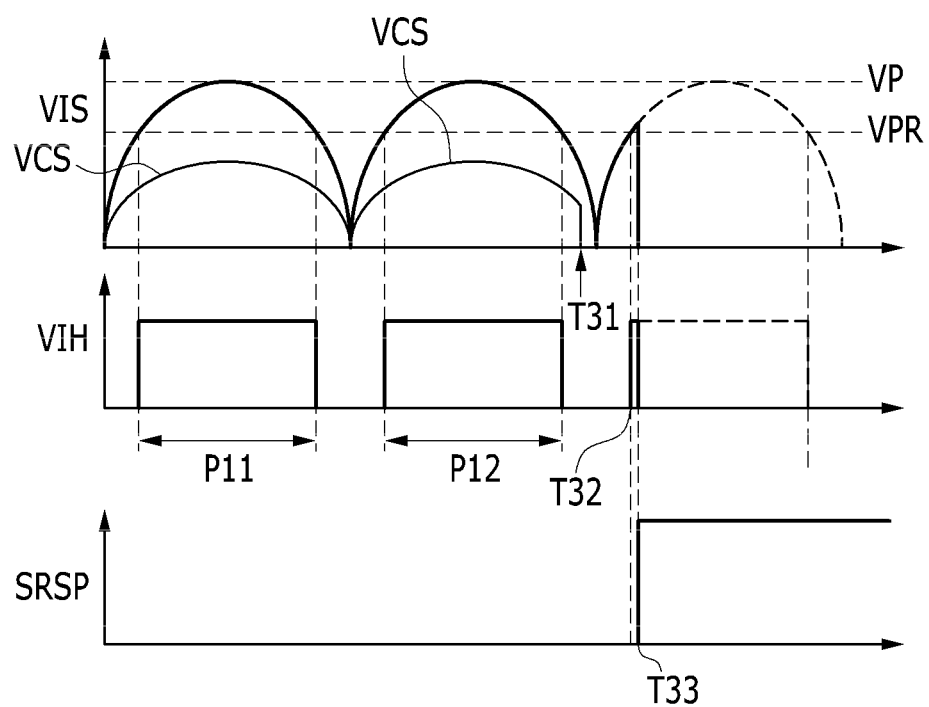
FIG. 8 is a waveform illustrating an input sense voltage, a sense voltage, an input high signal, a peak reference voltage, and a short-circuit protection signal according to another exemplary embodiment of the present invention in a case in which a short-circuit of a sense resistor occurs outside of the short-circuited resistor detection period.

FIG. 8 is a waveform illustrating an input sense voltage, a sense voltage, an input high signal, a peak reference voltage, and a short-circuit protection signal according to another exemplary embodiment of the present invention in a case in which a short-circuit of a sense resistor occurs not during the short-circuited resistor detection period.

In FIG. 8, it is assumed that a short-circuit of a resistor RS occurs at T31 after a short-circuited resistor detection period P12 is terminated.

An input sense voltage VIS is generated in a normal state, and the input sense voltage VIS is higher than a peak reference voltage VPR during short-circuited resistor detection periods P11 and P12. Thus, the input high signal VHI is the high level during the short-circuited resistor detection periods P11 and P12.

At T31, a sense voltage VCS is not generated due to a short-circuit of the sense resistor RS. However, since the short-circuited resistor detection period P12 is terminated and the input high signal VIH is the low level, a shut-down signal SD, which is an output of an AND gate 460, is the low level. Therefore, a short-circuit protection signal SRSP is not triggered.

From T32, the input sense voltage VIS is higher than the peak reference voltage VPR and the input high signal VIH is increased to the high level. Then, all inputs of the AND gate 460 become the high level at a time that an on-time signal TON becomes the high level (i.e., turn-off time of the power switch), and the shut-down signal SD is increased to the high level. Thus, the short-circuit protection signal SRSP is triggered to the high level at T33, and the protection operation starts. The switching operation of the power switch SW is stopped by the protection operation. Then, from T33, no input sense voltage VIS is generated and no input high voltage VIH is generated.

However, when the input voltage Vin is detected using the method shown in FIG. 3, the input sense voltage VIS and the input high signal VIH may be generated as shown as the dotted line in FIG. 8.

Figure 9:
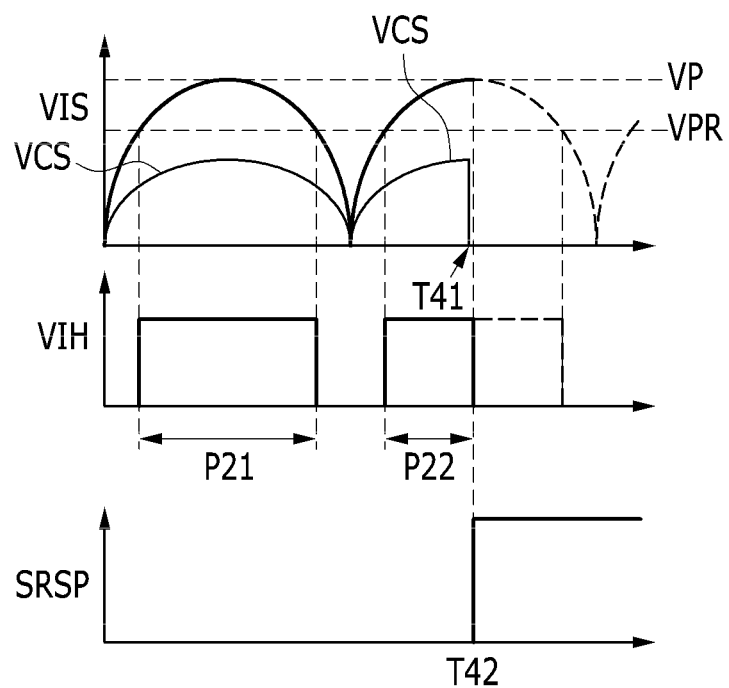
FIG. 9 is a waveform diagram illustrating an input sense voltage, a sense voltage, an input high signal, a peak reference voltage, and a short-circuit protection signal according to another exemplary embodiment of the present invention in a case in which a short-circuit of a sense resistor occurs during a short-circuit resistor detection period.

FIG. 9 is a waveform diagram illustrating an input sense voltage, a sense voltage, an input high signal, a peak reference voltage, and a short-circuit protection signal according to another exemplary embodiment of the present invention in a case in which a short-circuit of a sense resistor occurs during a short-circuit resistor detection period.

An input sense voltage VIS is generated in a normal state, and the input sense voltage VIS is higher than a peak reference voltage VPR during short-circuited resistor detection periods P21 and P22. Thus, an input high signal VIH is the high level during the short-circuited resistor detection periods P21 and P22.

At T41, a sense voltage VCS is not generated due to the short-circuit of the sense resistor RS. Then, after T41, all inputs of an AND gate 460 become high level at a time that an on-time signal TON becomes the high level (i.e., a turn-off time of the power switch), and a shut-down signal SD is increased to the high level. Then, at T42, a short-circuit protection signal SRSP is triggered to the high level, and the protection operation starts. The switching operation of the power switch SW stops by the protection operation. Then, from T42, no input sense voltage VIS is generated and no input high signal VIH is generated.

However, when the input voltage Vin is detected using the method shown in FIG. 3, the input sense voltage VIS and the input high signal VIH may be generated as shown as the dotted line in FIG. 9.

Hereinafter, a generation process of a short-circuit protection signal SRSP in the case of occurrence of a short-circuit will be described with reference to FIG. 10.

Figure 10:
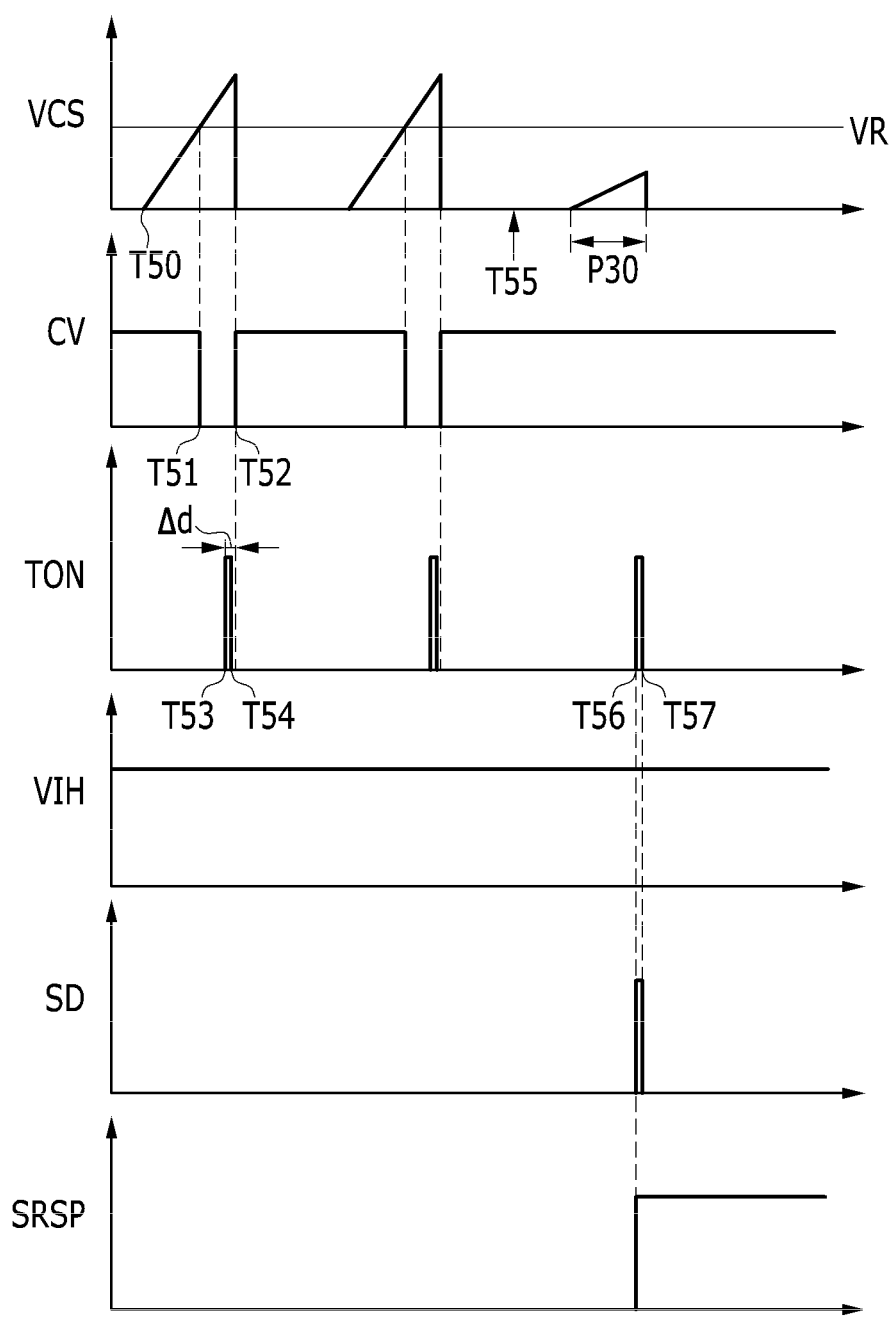
FIG. 10 is a waveform diagram illustrating a sense voltage, a comparison signal, an on-period signal, an input high signal, a shut-down signal, and a short-circuit protection signal according to another exemplary embodiment of the present invention.

FIG. 10 is a waveform diagram illustrating a sense voltage, a comparison signal, an on-period signal, an input high signal, a shut-down signal, and a short-circuit protection signal according to another exemplary embodiment of the present invention. FIG. 10 partially illustrates a short-circuited resistor detection period.

As shown in FIG. 10, at T50, a power switch SW is turned on and a sense voltage VCS starts to increase. At T51, the increasing sense voltage VCS reaches a reference voltage VR, and thus a comparison signal CV becomes the low level. At T52, the power switch SW is turned off, no sense voltage VCS is generated, and the comparison signal CV becomes the high level.

When the turn-off of the power switch SW is determined at T53, the on-time signal TON is increased to the high level, and then the on-time signal TON is decreased to the high level at T54. A predetermined delay may occur between the turn-off determination time T53 and the turn-off time T52 of the power switch SW. For example, a transmission delay Δd may occur between T53 at which the power switch SW is determined to be turned off in a PWM controller 200 and T52 at which the power switch SW is turned off by a low-level gate voltage VG.

As described, a section during which all inputs of the AND gate 460 become high level does not occur in a normal state.

Assume that the sense resistor RS is short-circuited at T55. Although the power switch SW is turned off, a sense voltage VCS does not reach a reference voltage VR during a turn-on period P30 as shown in FIG. 10.

Then, while a comparison signal CV is maintained at the high level, an on-time signal TON is generated as a high-level pulse during T56 and T57. At T56, all inputs of the AND gate 460 become the high level and a shut-down signal SD is increased to the high level, and when the on-time signal TON is decreased to the low level at T57, the shut-down signal SD is also decreased to the low level.

At T56, a short-circuit protection signal SRSP is increased to the high level due to an increase of the shut-down signal SD, and the protection operation is triggered.

As described, a short-circuit of the sense resistor can be determined by the above-described exemplary embodiments.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS power supply 1
rectification circuit 10
capacitor C1
transformer 20
rectification diode D1
output capacitor C2
power switch SW
sense resistor RS
switch control circuit 30
sense resistor short-circuit determiner 100, 300, and 400
PWM controller 200
input voltage detector 110 and 410
blanking period setting unit 120 and 310
sense voltage comparator 130 and 450
AND gate 140 and 460
signal generator 150 and 470
auxiliary wire CO3
peak detector 420
multiplier 430
input comparator 440
resistor R1, R2, R3, R4
primary wire CO1
secondary wire CO2

What is claimed is:

1. A sense resistor short-circuit determiner, comprising:
an input voltage detector configured to detect an input voltage coupled to a power switch and to generate an input sense voltage;
a sense voltage comparator configured to compare a sense voltage and a reference voltage to generate a comparison signal, the sense voltage being generated by a current that flows from the power switch to a sense resistor when the power switch is turned on to couple the input voltage to the sense resistor; and
a blanking period setting unit that is configured to set a blanking period during which the sense resistor short-circuit determiner does not determine a short-circuit of the sense resistor, a beginning of the blanking period being synchronized to a turn-on time of the power switch,
wherein the sense resistor short-circuit determiner is configured to detect the short-circuit of the sense resistor within a sensing time and according to the comparison signal,
wherein the sensing time starts after expiration of the blanking period, and a length of the sensing time is changed according to the input voltage.

2. The sense resistor short-circuit determiner of claim 1, wherein:
the blanking period setting unit is configured to set the blanking period based on a time for the sense voltage to reach the reference voltage in a previous switching cycle.

3. The sense resistor short-circuit determiner of claim 1, wherein the blanking period setting unit sets the blanking period based on an inverse of variation of the input sense voltage.

4. The sense resistor short-circuit determiner of claim 1, wherein the short-circuit of the sense resistor is detected according to the comparison signal during a turn-on period of the power switch.

5. The sense resistor short-circuit determiner of claim 1, further comprising a logic gate configured to detect the short-circuit of the sense resistor by performing a logic operation on the comparison signal and a gate control signal that controls switching operation of the power switch.

6. The sense resistor short-circuit determiner of claim 1, wherein the length of the sensing time is set according to a result of comparison between the input sense voltage and a predetermined peak reference voltage that is based on a peak voltage of the input sense voltage.

7. The sense resistor short-circuit determiner of claim 6, further comprising an input comparator configured to generate an input high signal that indicates the sensing time when the input sense voltage is higher than the peak reference voltage.

8. The sense resistor short-circuit determiner of claim 7, wherein, in the sensing time, the short-circuit of the sense resistor is detected according to the comparison signal at a power switch turn-off determination time during a turn-on period of the power switch.

9. The sense resistor short-circuit determiner of claim 8, further comprising a logic gate configured to detect the short-circuit of the sense resistor by performing a logic operation on the input high signal, the comparison signal, and an on-time signal generated by being synchronized at the power switch turn-off determination time.

10. The sense resistor short-circuit determiner of claim 6, further comprising:
a peak detector configured to detect a peak voltage of the input sense voltage; and
a multiplier configured to generate the peak reference voltage by multiplying a predetermined gain by the peak voltage.

11. The sense resistor short-circuit determiner of claim 1, wherein the sense resistor is determined to be short-circuited when the reference voltage is higher than the sense voltage during the sensing time.

12. The sense resistor short-circuit determiner of claim 1, wherein the sensing time is set according to a result of comparison between the input sense voltage and a predetermined peak reference voltage based on a peak voltage of the input sense voltage, and the sense resistor is determined to be short-circuited when the reference voltage is higher than the sense voltage during a turn-on period of the power switch during the sensing time.

13. The sense resistor short-circuit determiner of claim 1, wherein the reference voltage is based on the input voltage.

14. A switch control circuit for controlling a switching operation of a power switch that is electrically coupled to an input voltage, comprising:
a sense resistor;
a PWM controller configured to control the switching operation of the power switch using a sense voltage generated by a current of the power switch flowing to the sense resistor; and
a sense resistor short-circuit determiner configured to generate an input sense voltage by detecting the input voltage, to set a blanking period during which the sense resistor short-circuit determiner does not determine a short-circuit of the sense resistor, and to detect the short-circuit of the sense resistor within a sensing time and according to a result of a comparison between the sense voltage and a reference voltage,
wherein a beginning of the blanking period is synchronized to a turn-on time of the power switch, and
wherein the sensing time starts after expiration of the blanking period, and a length of the sensing time is adjusted according to the input voltage.

15. The switch control circuit of claim 14, wherein:
the sense resistor short-circuit determiner is configured to determine the sense resistor to be short-circuited when the reference voltage is higher than the sense voltage during the sensing time.

16. The switch control circuit of claim 15, wherein the sense resistor short-circuit determiner sets the blanking period based on an inverse of variation of the input sense voltage.

17. The switch control circuit of claim 14, wherein the sense resistor short-circuit determiner is to set the sensing time according to a result of comparison between the input sense voltage and a predetermined peak voltage based on a peak voltage of the input sense voltage, and is to determine the sense resistor to be short-circuited when the reference voltage is higher than the sense voltage during a turn-on period of the power switch in the sensing time.

18. The switch control circuit of claim 17, wherein the sense resistor short-circuit determiner is to determine the sense resistor to be short-circuited when the reference voltage is higher than the sense voltage at a power switch turn-off determination time during the turn-on period of the power switch in the sensing time.

19. The switch control circuit of claim 14, wherein the reference voltage is based on the input voltage.

20. A power supply comprising:
a power switch electrically coupled to an input voltage;
a sense resistor coupled to the power switch to sense a current flowing through the power switch when the power switch couples the input voltage to the sense resistor; and
a sense resistor short-circuit determiner configured to generate an input sense voltage by detecting the input voltage, to set a blanking period during which the sense resistor short-circuit determiner does not determine a short-circuit of the sense resistor, and to detect a short-circuit of the sense resistor within a sensing time and according to a result of comparison between a sense voltage of the sense resistor and a reference voltage sensed,
wherein a beginning of the blanking period is synchronized to a turn-on time of the power switch, and
wherein the sensing time starts after expiration of the blanking period, and a length of the sensing time is changed according to the input voltage.

21. The power supply of claim 20, wherein:
the sense resistor short-circuit determiner is configured to determine the sense resistor to be short-circuited when the reference voltage is higher than the sense voltage during the sensing time.

22. The power supply of claim 20, wherein the sense resistor short-circuit determiner is to set the sensing time according to a result of comparison between the input sense voltage and a predetermined peak reference voltage based on a peak voltage of the input sense voltage, and is to determine the sense resistor to be short-circuited when the reference voltage is higher than the sense voltage during a turn-on period of the power switch in the sensing time.

23. The power supply of claim 20, wherein the power supply further comprises an auxiliary wire electromagnetically coupled with a primary wire coupled to the input voltage, wherein an auxiliary voltage, which is a voltage between lateral ends of the auxiliary wire, is a negative voltage that depends on the input voltage during a turn-on period of the power switch; and the sense resistor short-circuit determiner is to generate the input sense voltage using a voltage sense current supplied to the auxiliary wire to clamp a voltage of a node coupled to the auxiliary wire to a predetermined voltage during the turn-on period of the power switch.

24. The power supply of claim 20, wherein the reference voltage is based on the input voltage.

* * * * *